(12) United States Patent
Prucnal (10) Patent No.: US 6,265,999 B1
(45) Date of Patent: Jul. 24, 2001

(54) HIGH-SPEED SERIAL-TO-PARALLEL AND ANALOG-TO-DIGITAL CONVERSION

(75) Inventor: Paul R. Prucnal, Princeton, NJ (US)

(73) Assignee: Trustees of Princeton University, Princeton, NJ (US)

( * ) Notice: Subject to any disclaimer, the term of this patent is extended or adjusted under 35 U.S.C. 154(b) by 0 days.

(21) Appl. No.: 08/941,364

(22) Filed: Sep. 30, 1997

(51) Int. Cl.⁷ .................................................. H03N 1/00
(52) U.S. Cl. ......................... 341/137; 341/155; 359/237
(58) Field of Search ..................... 341/155, 100, 341/137, 139; 359/237, 245, 340, 341

(56) References Cited

U.S. PATENT DOCUMENTS

| | | | |
|---|---|---|---|
| 4,947,170 | 8/1990 | Falk ..................... | 341/137 |
| 5,010,346 | 4/1991 | Hamilton et al. ..................... | 341/137 |
| 5,493,433 | 2/1996 | Prucnal et al. ....................... | 359/123 |
| 5,555,119 | * 9/1996 | Lewis ..................... | 359/158 |
| 5,831,752 | 11/1998 | Cotter et al. .......................... | 359/135 |
| 5,887,092 | * 3/1999 | Van Der Tol ........................... | 385/27 |
| 5,999,293 | 12/1999 | Manning ............................... | 359/139 |
| 6,028,424 | * 2/2000 | Twichell et al. ........................ | 324/96 |

FOREIGN PATENT DOCUMENTS

| | | |
|---|---|---|
| 0 103 468 | 3/1984 | (EP) . |
| WO 96/05664 | 2/1996 | (WO) . |

OTHER PUBLICATIONS

Koga R., et al: "A Single–Shot Measurement of a Picosecond Optical Pulse Waveform", pp. 373–379, vol. 236, 1980—European Conference on Optical Systems and Applications (Utrecht).

Kung–Li Deng et al: "Single–Shot Optical Sampling Oscilloscope for Ultrafast Optical Waveforms", pp. 268–269, vol. 6,—CLEO' 98.

Kung–Li Deng et al: "Single–Shot Optical Sampling Oscilloscope for Ultrafast Optical Waveforms", pp. 397–399, vol. 10, No. 3—IEEE Photonics Technology Letters, 3/98, IEEE, USA.

* cited by examiner

*Primary Examiner*—Peguy JeanPierre
(74) *Attorney, Agent, or Firm*—Pennie & Edmonds LLP (57) ABSTRACT

An optical-to-electrical converter includes an input port configured to receive an optical signal. The converter further includes a splitter configured to split the received optical signal into a plurality of optical signals. An optical stage has a plurality of parallel stages, and each parallel stage receives a corresponding one of the plurality of identical signals and outputs a corresponding one of a plurality of sampled optical signals within a corresponding sampling window. A plurality of delay circuits receive a clock signal having a plurality of clock pulses separated by a clock period. The delay circuits respectively output a plurality of control pulses at a plurality of delayed timings with respect to each clock pulse of the clock signal. An electrical stage receives the plurality of sampled optical signals and processes the optical signals at a sampling rate corresponding to the clock period of the clock signal.

34 Claims, 10 Drawing Sheets

HIGH-SPEED SERIAL-TO-PARALLEL AND ANALOG-TO-DIGITAL CONVERSION

BACKGROUND OF THE INVENTION

1. Field of the Invention

The present invention relates generally to the field of optoelectronic devices and, more particularly, to devices which function as extremely high speed optical shutters, and to applications of such devices.

2. Description of the Related Art

A number of important commercial, scientific, medical and military signal processing or sampling applications require high speed conversion of time-varying analog waveforms into digital form. Such higher digitization speed is useful because, among other reasons, it provides better spatial resolution for lidar and range-finding, better time resolution for clock synchronization protocols, better instrumental resolution for sampling oscilloscopes, and better channel separation for wideband receivers. Higher speed analog-to-digital (A/D) converters are additionally sought because there is often a threshold conversion rate below which the application requiring the samples is infeasible, such as digital receivers operating in a particular microwave band.

It is known that an analog serial-to-parallel (S/P) converter can be used to parcel out portions of a time-varying waveform to parallel A/D converters working in parallel. In such systems, the quality of the S/P converter stage bounds the subsequent fidelity of the overall converter, so manufacturability and control of noise are crucial considerations. Unfortunately, today's all-electronic S/P converters operate well below 60 gigasamples per second (GSPS), which is not much faster than today's state-of-the-art electronic A/D converters (e.g., 6 GSPS claimed by Rockwell in the laboratory, for which, to applicants' knowledge, no publicly-available enabling disclosure exists), so there is little fan-out by the S/P converter. By way of comparison, all-optical switching/sampling phenomena can occur at intrinsically higher speeds than analogous electronic phenomena, since electron mobility in the solid state is up to 10,000-fold slower than the speed of light; the advantage is lessened by the ratio of device sizes.

SUMMARY OF THE INVENTION

Accordingly, it is among the objects of the instant invention to provide one or more of the following: (i) an improved A/D converter operating at optical speeds yet benefiting from progress in the speed of electronic devices; (ii) an integrated, fast A/D converter; (iii) an improved A/D converter with calibrated outputs and servo-controlled input range; (iv) an improved A/D converter with a parallel output signal; (v) an improved A/D converter in a circuit; (vi) an A/D converter embedding a fast analog S/P converter; (vii) an integrated fast analog S/P converter; (viii) a fast analog optical S/P converter employing a TOAD (as defined below); (ix) an improved, fast analog S/P converter with adjustable input dynamic range; (x) an improved S/P converter with physical clocking; and (xi) a device capable of converting an optical waveform into piecewise portions employing a TOAD.

In accordance with these and other objects, there is provided an analog-to-digital converter, which includes a first input port configured to receive an analog optical waveform. The converter also includes a splitter connected to the first input port and configured to split the analog optical waveform into a plurality of identical waveforms. The converter further includes a second input port configured to receive a clock signal having a predetermined clock period. The converter also includes a delay circuit configured to receive the clock signal and to output a plurality of delayed clock signals each having different a different delay with respect to others of the delayed clock signals. The converter still further includes a plurality of optical shutters configured to respectively receive the plurality of identical waveforms on an input port thereof, and configured to receive a corresponding one of the plurality of delayed clock signals on a control port thereof, each of the plurality of optical shutters having an output port for outputting the corresponding one of the identical waveforms within a time period in a range of 0.01 psec to 100 psec. The converter also includes a plurality of photodetectors respectively connected to the output ports of the plurality of optical shutters and configured to convert an input optical signal into an output electrical signal. The converter further includes a plurality of electrical analog-to-digital converters respectively connected to the output ports of the plurality of optical shutters and configured to perform an analog-to-digital conversion of the corresponding electrical signal into a digital signal. The number of electrical analog-to-digital converters in a fully populated configuration is such that a conversion time of said analog-to-digital converters divided by the number of electrical analog-to-digital converters is slightly less than the time period of the optical shutters.

Aspects of the system and method according to the invention exploit and improve upon recent advances in high speed optical shutter technology, notably the Terahertz Optical Asymmetric Demultiplexer (TOAD), disclosed in U.S. Pat. No. 5,493,433, which is incorporated in its entirety herein by reference. Whereas most optical shutters require impractically long interaction lengths, high power, or both; the TOAD is compact and low power.

The TOAD exploits a strongly non-linear optical effect which allows a gating pulse to cause either 0 or pi radians of phase delay in a signal introduced into an interferometer. The phase delay switches off after a brief interval, of the order of 1 picosecond (psec), so a signal beam meeting with itself in a TOAD interferometer will emit only the waveform sampled by the 1 psec shutter window. In contrast to conventional semiconductor logic gates, the TOAD does not try to switch and reset in a small multiple of the shutter cycle time. Rather, the TOAD can undergo an Open/Off cycle only once before it needs to recover, typically for 100 psec. When combined with a precise optical delay line, each TOAD can be used to sample (read) or inject (write) a signal's amplitude or intensity in the shutter window time. The TOAD is then latent, waiting for the electronics to invoke it again (e.g. every 4 nanoseconds (nsec) for 250 MHz CMOS).

Utilizing such high speed optical shutters, in accordance with the system and method according to the invention, it is possible to provide high speed, high quality S/P conversion, and therefore high speed A/D converter systems embedding a fast analog optical S/P converter with fan-out to whatever degree is necessary to support operation beyond 1000 gigasamples per second (GSPS). Also, in accordance with the invention, systems may include all-electrical A/D converter devices, thus providing a back-end with optimal price/performance. Preferably, the balance between more fan-out in the S/P converter and more, lower-cost slow electrical A/D converters in the back-end is optimally selected, based upon overall price, performance, manufacturability, or other criteria. While the present invention may be, and preferably is, practiced using the TOAD, the concepts, teachings, and applications described herein below are by no means limited to TOAD-based systems, and will work with other optical shutters, other sequences of functional units, and with novel electrical A/D converters.

In accordance with the invention, the TOADs will preferably be solid state and formed by mass production processes. For instance, integrated semiconductor optical amplifiers (SOAs) under development at Princeton University, British Telcom, NEC, and elsewhere can be combined with integrated optical paths to form complete TOAD devices. SOAs can advantageously be formed using materials from columns III and V in the periodic table (e.g. GaAs), or II–VI materials; a plurality of optical paths can be formed on a low cost substrate; and the two monolithic constructions bonded together. Additionally or alternatively, a plurality of optical paths may be formed on the same substrate as the TOADs by additive, subtractive, or even selective phase-change direct-write processes. One may apply light, charged particle beam, heat, or other known methods to cure the waveguide material or optical interconnects.

In accordance with a preferred embodiment of the instant invention, the time-varying magnitude of an input signal is modulated by amplitude or intensity. In more general embodiments, modulation of the magnitude comprises a combination of amplitude modulation, polarization modulation, phase modulation, and frequency modulation. These can all be exploited in their own right by appropriate TOAD embodiments, or reduced to amplitude or intensity modulation and treated as in the preferred embodiment. For instance, a polarized signal can be converted into an intensity modulated signal by being passed through a cross-polarizer. A frequency modulated signal can be converted into an amplitude modulated signal in a number of ways, including filtering with a color-sensitive transmitter or reflector; or diffracting or refracting and then using position, time of flight, or phase information. A frequency modulated signal can be converted into an intensity modulated signal by interfering it with a coherent reference beam of comparable intensity and sampling the beat frequency. In general, modulation can be permitted to occur within the TOAD, instead of just prior to it. For instance, a phase modulated signal can be converted into an intensity modulated signal by being superposed on a coherent reference signal of comparable intensity within the TOAD interferometer itself, thus replacing the input splitter described in the '433 patent with a bypass on one side and a reference beam for differential measurement on the other side. This brief description is exemplary and not comprehensive. As those skilled in the art will appreciate, other methods are known, and it is anticipated that there will be future embodiments of optical shutters which will be appropriate for use in this invention.

BRIEF DESCRIPTION OF THE FIGURES

Various aspects, features, applications, and advantages of the instant invention are depicted in the accompanying set of drawings, which are intended to be exemplary and not limiting or exhaustive, and in which, briefly stated.

DETAILED DESCRIPTION OF THE PREFERRED EMBODIMENT(S)

Figures 1, 2:
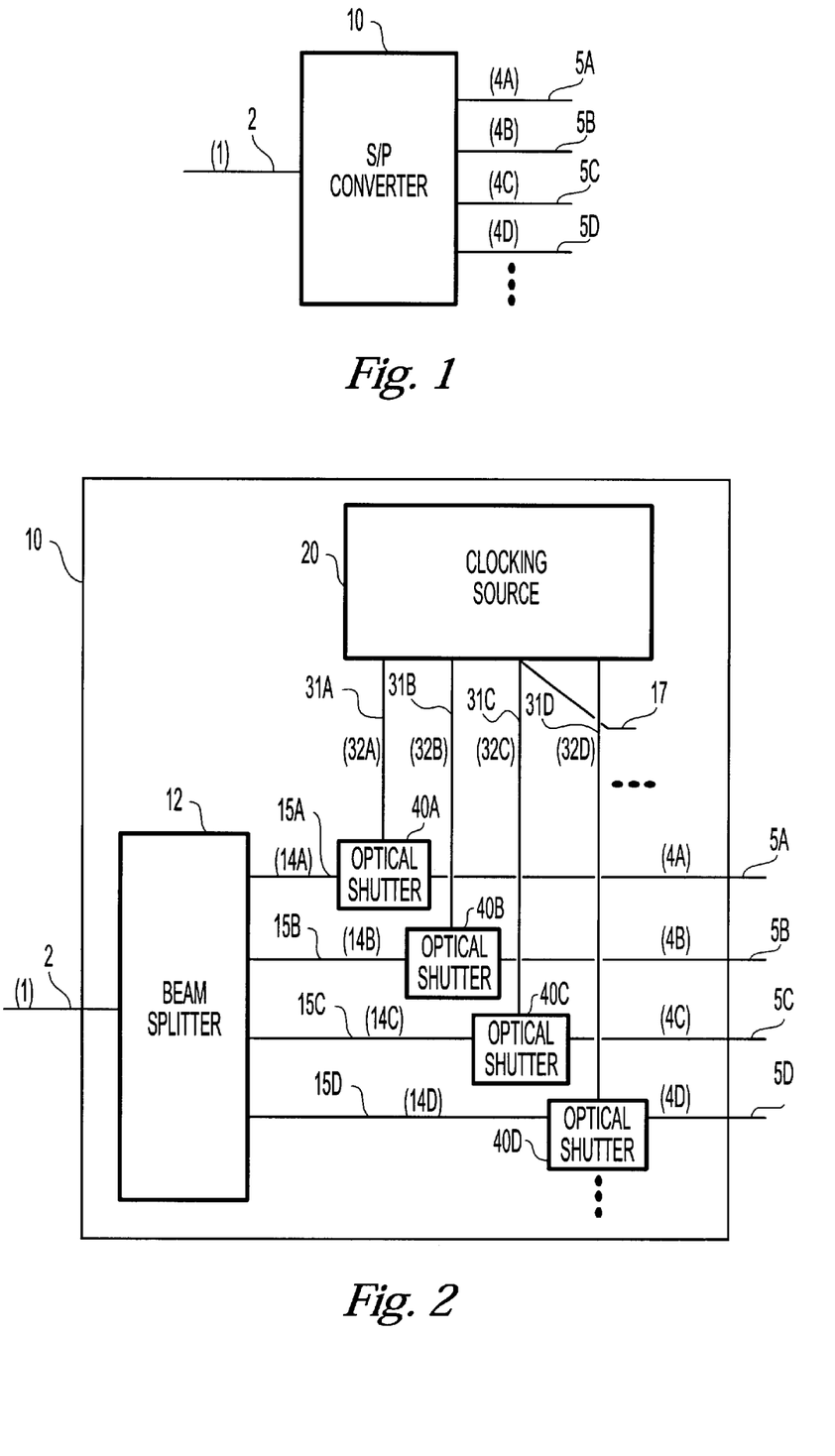
FIG. 1 illustrates a preferred embodiment of an analog optical S/P converter in block form.
FIG. 2 illustrates an analog optical S/P converter in greater detail.
Figure 9:
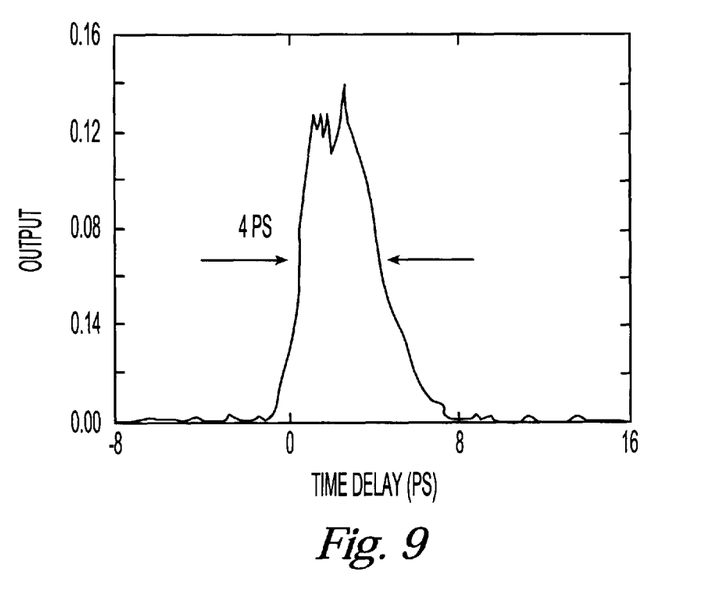
FIG. 9 shows a measured TOAD waveform.

Reference is now made to FIG. 1, which illustrates a preferred embodiment of an analog optical S/P converter in block form. Optical input signal (1) enters an optical S/P converter (10) by means of an optical path (2). Signal (1) is preferably coherent light, such as 1.5 $\mu$m light, and comprises a waveform, such as shown in FIG. 9. Preferably, but not necessarily, signal (1) has already been amplitude or intensity modulated with certain data of interest. Path (2) is preferably an integrated waveguide, although a variety of designs for optical paths through free-space and guided paths (e.g. optical fibers) can be substituted, as would be appreciated by persons skilled in the art, e.g., optical engineers.

A plurality of output signals emerge from S/P converter (10), illustrated as signal (4A) on path (5A), signal (4B) on path (5B), and so forth. The reader should interpret references to "signal (4)" without a suffix as applying to a plurality of (4A), (4B), etc., and similarly with "path (5)" as applying to paths (5A), (5B), etc. Output signals (4) contain information from the input signal (1), and are preferably optical replicas of input signal (1), although a plurality of them may be scaled to different amplitudes from the input signal (1) and/or from each other. Optionally, output signals (4) may comprise functional modifications of input signal (1), such as linearization corrections, and/or may mix in other signal streams, such as a monochromatic reference beam.

Reference is now made to FIG. 2, which illustrates an optical analog S/P converter in greater detail. In this embodiment, a beam splitter (12) replicates an input signal (1) into a plurality of output signals (14), which exit on their optical paths (15). As persons skilled in the art will appreciate, one can purchase beam splitters with high uniformity and low parasitic losses commercially from a number of vendors, and beam splitters can also be integrated with optical or optoelectronic subsystems using well-known lithographic or casting techniques.

Each of a plurality of optical shutters (40) is fed both by a signal (14) along an optical path (15) from the beam splitter (12) and also by a clock signal (32) carried by an optical path (31). Each optical shutter (40) emits an output signal (4) on a path (5).

Clock signals (32) are illustrated schematically as originating from a single clocking source (20), but use of multiple clocking sources is permissible. The signal path (17) output of the input master clock (20) is used to synchronize the electrical A/D stages and subsequent latching circuitry.

Figure 3:
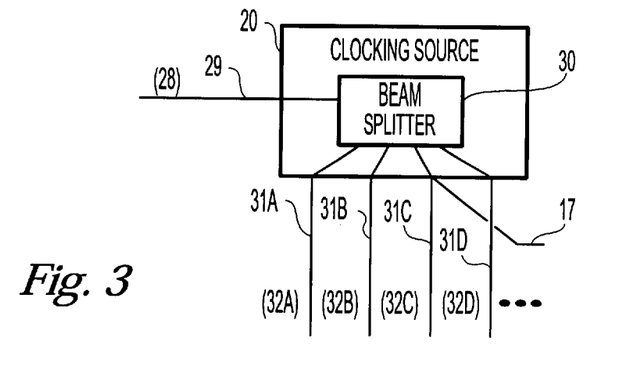
FIG. 3 illustrates a beam splitter used in a clocking source.

Reference is now made to FIG. 3, which illustrates a beam splitter (30) used in a clocking source (20). In this embodiment, a master clock signal (28) of periodic pulses is introduced along path (29) and distributed as clock signals (32) among paths (31). Optionally, output clock signals (32) may comprise functional modifications of master clock signal (28), for instance by pulse-sharpening, clock-doubling, or polarization. Other signals may optionally be mixed in with output clock signals (32), such as complex waveforms. As one skilled in the art will appreciate, a number of clock distribution topologies are known to electronics engineers, with different topologies appropriate for different embodiments, such as a star-of-stars hierarchy for obtaining sufficient fan-out with tight timing synchrony. Some of these topologies also include an amplification unit within the clocking source (20).

Figure 4:
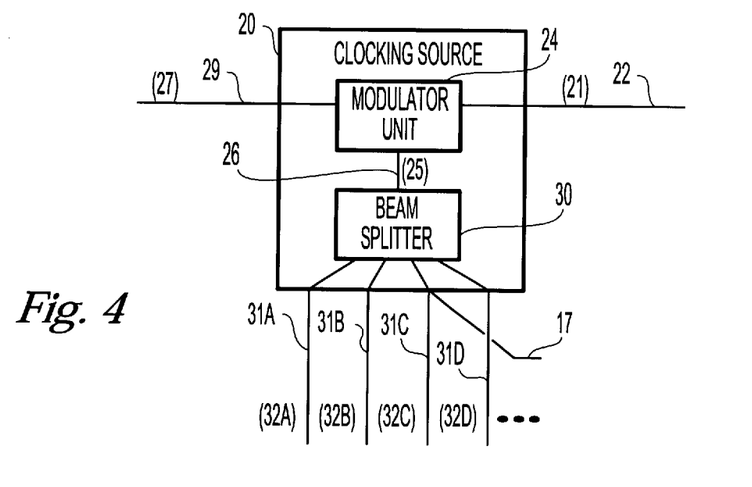
FIG. 4 illustrates a clocking source including a modulator unit.

Reference is now made to FIG. 4, which illustrates a clocking source (20) including a modulator unit (24) providing an optical signal (25) along optical path (26) to a beam splitter (30). A light signal (27) input from path (29) is preferably constant brightness from a coherent laser. The beam splitter could preferably be similar to the one illustrated in FIG. 3. If the modulator (24) is electro-optical, then it will preferably be fed by an RF electrical trigger signal (21) from an RF input path (22). If the modulator unit (24) is optoelectronic, then it will preferably be fed by an optical trigger signal (21) from an optical input path (22). Mixtures of electrical and optical inputs may also be imposed as a trigger signal (21) along a suitable plurality of paths (22).

Modulator unit (24) may require a power source, but such sources are well known to those skilled in the art, and are not depicted in the drawings in order to avoid distracting from the description of the present invention.

Figure 5:
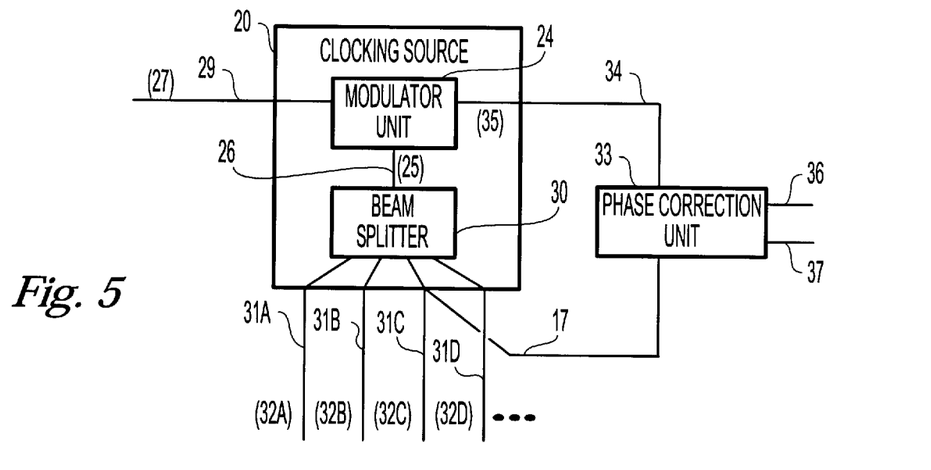
FIG. 5 illustrates a "physically clocked" embodiment of a clocking source.

Reference is now made to FIG. 5, which illustrates a "physically clocked" embodiment of a clocking source. Use of a beam splitter with one-more-than-$2^N$ outputs is preferred, but not required. The function of modulator (24) in this embodiment is to convert a "flyback" trigger signal (35) into a suitable input for beam splitter (30), preferably by amplification and pulse-sharpening, so that a preferred clocking source (20) emits clocking waveforms (e.g., pulses) in parallel at precise periodic intervals that do not depend on the coherence of an external clock. An optical clock signal (32C) is provided by optical path (31C) to optional phase correction unit (33), which emits signal (35) after that time interval necessary to ensure that the periodicity of pulses arriving at beam splitter (30) is a constant. There can be one or a number of pulses in transit traversing the circuit encompassing (34), (24), (26), (30), (32), and optionally (33); the circuit serves as a delay line. If optional phase correction unit (33) is omitted, path (31C) and path (34) number the same item.

The optional phase correction unit (33) can serve to adjust the timing of the arrival of clock signal (35) at modulator unit (24), and can be internally controlled by a clock or externally controlled along a path (37), such as by "trimming" feedback from elsewhere in the S/P converter or a system embedding it. A number of units for phase correction are well-known, including stretching optical fibers and tight temperature control.

A starting signal is used for the clocking source (20), and the clocking can run thereafter without requiring an external clock. There are a number of units for providing a starting signal. An optional input (36) may be provided through phase correction unit (33) or directly into modulator unit (24) to provide a pulse from outside as the starting signal; or, the starting signal can be generated internally, for instance by compounding its amplification through repeated cycles until effective.

Figure 6:
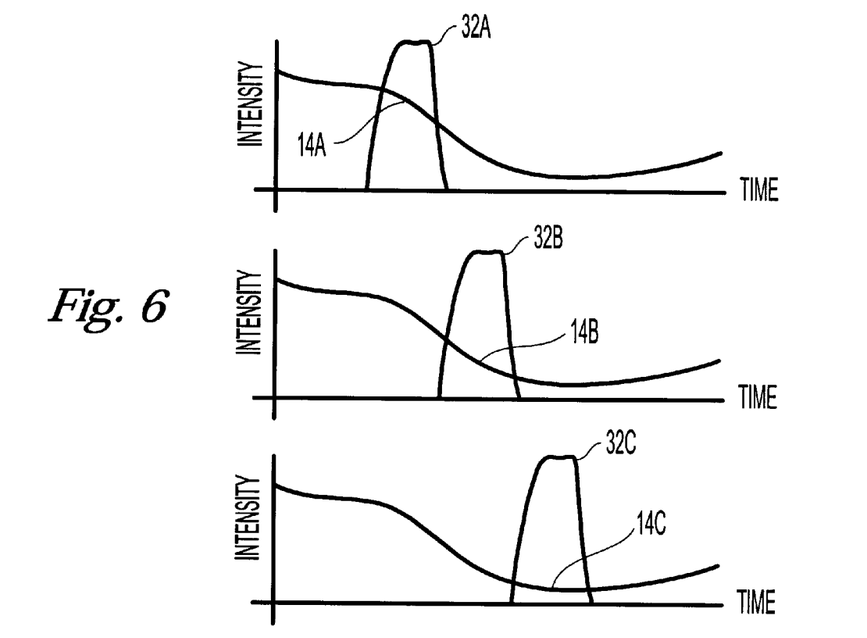
FIG. 6 illustrate the use of delay lines to retard clock signals.
Figure 7:
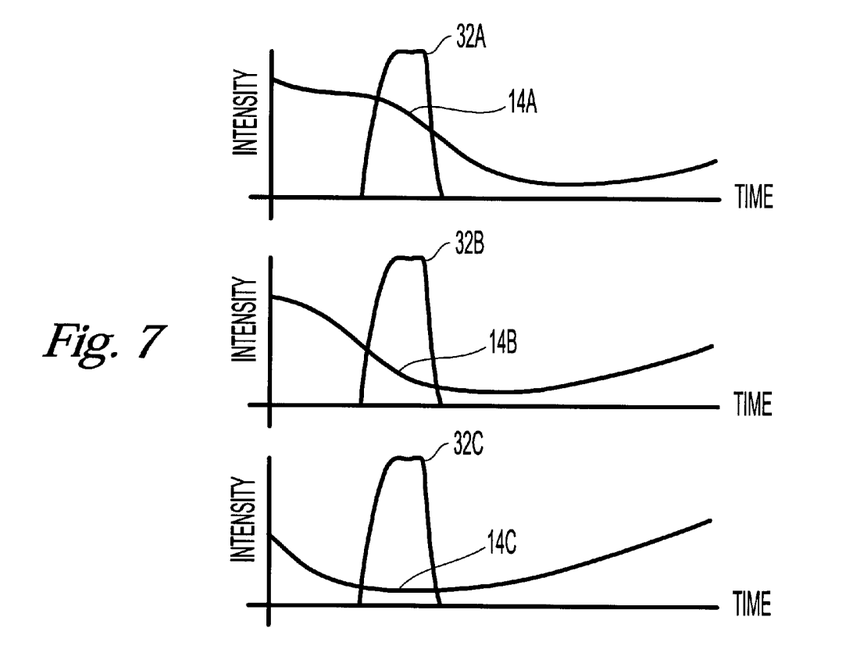
FIG. 7 illustrate the use of delay lines to retard data signals.

Reference is now made to FIG. 2, FIG. 6 and FIG. 7, which illustrate the use of delay lines to relate the relative timing of clock signals (32) and signal waveforms (4). Note that an optical path length is determined by a path's index of refraction as well as its physical length. In the embodiment shown in FIG. 6, the optical lengths of the signal paths (15) are all the same, but each clock path (31A), (31B), (31C), and so forth has an optical length chosen to provide timing delays in successive integer units of τ. In an alternative embodiment shown in FIG. 7, the optical lengths of the clock paths (31) are all the same, but each signal path (15A), (15B), (15C), and so forth has an optical length chosen to provide timing delays in successive integer units of τ. More complicated patterns can be utilized while remaining within the scope of the invention as described herein. For example, in embodiments of most value in certain applications, manufacturability considerations make it preferable for the ensemble of clock signals (32) and the ensemble of waveforms (14) to intersect at a variety of times and places, in a matrix-like configuration (e.g., clustered on chips in a module). Nor must the intersections be regular; in some embodiments for applications described below, they need not all have the same time intervals τ, nor comprehensive coverage, nor sequential ordering.

Figure 8:
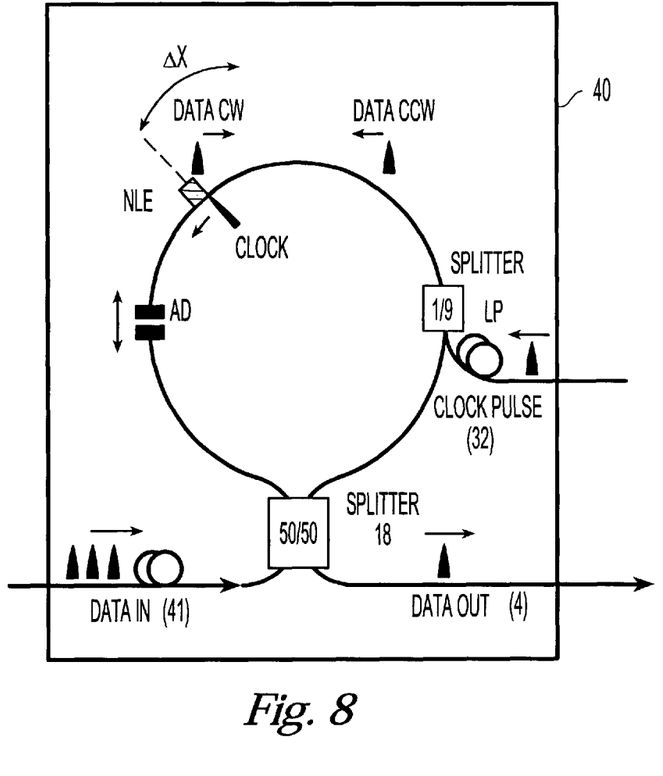
FIG. 8 illustrates an optical shutter unit implemented in a Terahertz Optical Asymmetric Demultiplexer.

Reference is now made to FIG. 8, which illustrates an optical shutter unit (40) implemented in a TOAD, such as the Mach-Zehnder version disclosed in the '433 patent. Optical shutters can also be built using an amplitude-modulating TOAD constructed from a Mach-Zehnder, Michelson, or Sagnac interferometer by means of techniques well-known to those ordinarily skilled in the art. There have been attempts to build a TOAD using a loop mirror. These and other forms of TOAD are all appropriate for use as optical shutter units in connection with the instant invention, where each embodiment of an optical shutter (40) is preferably a TOAD (41) which gates a time-dependent input signal (14) with its time-dependent waveform (42) to an output signal (4) with a modulated magnitude.

Referring now to FIG. 8, the Terahertz Optical Asymmetric Demultiplexer (TOAD) comprises a fiber or waveguide loop joined at its base by the top half of a symmetric 2×2 splitter (18). The bottom side of the splitter (18) receives the signal input and transmits it to a photodetector at a receiver. In general operation, light from the input is split by the splitter into two identical waveforms which travel through the loop in opposing directions. Because the two signal components will have traversed exactly the same distance when they meet again in the splitter (18), purely constructive interference occurs; the splitter (18) therefore reflects all light back out the original input fiber and passes no light to the detector. This loop-mirror also contains a nonlinear element (e.g. a semiconductor optical amplifier (SOA)) located slightly off-center from the midway point. The asymmetric placement is the reason for the letter "A" in the word TOAD.

If injected into the loop before the signal pulse, a clock or pulse will change the nonlinear element's index of refraction for a brief period of time (the dwell time). This means that the light traversing the loop after the gating pulse has passed through the SOA will encounter a different propagation delay than light traversing the loop before the gating pulse pumped the SOA. An important feature of the TOAD is that this delay is engineered to be exactly one-half of a wavelength, or exactly enough to change the interference condition from constructive to destructive. The coupler therefore expels light to the photodetector instead of back out the input.

In accordance with Nyquist's Theorem, for a system with maximum frequency component $2/\tau$, no information is available about the shape (roughly speaking, $\sigma$) of the shutter waveform so long as $\sigma<\tau$. In practice, the shutter waveform (32) has a finite rise time and fall time, so cross talk is reduced significantly but not eliminated by making $\sigma$ somewhat smaller than $\tau$ (e.g. 50%).

Reference is now made to FIG. 9, which shows a measured TOAD waveform; in this case, 4 psec wide. The measurement was made by duplicating the output of a single TOAD device, delaying the second waveform by a variable interval (shown as the abcissa) and measuring the amplitude of the convolution of the first against the second (shown as the ordinate). The delay was swept from 0 to 10 psec and the results plotted.

Figure 10:
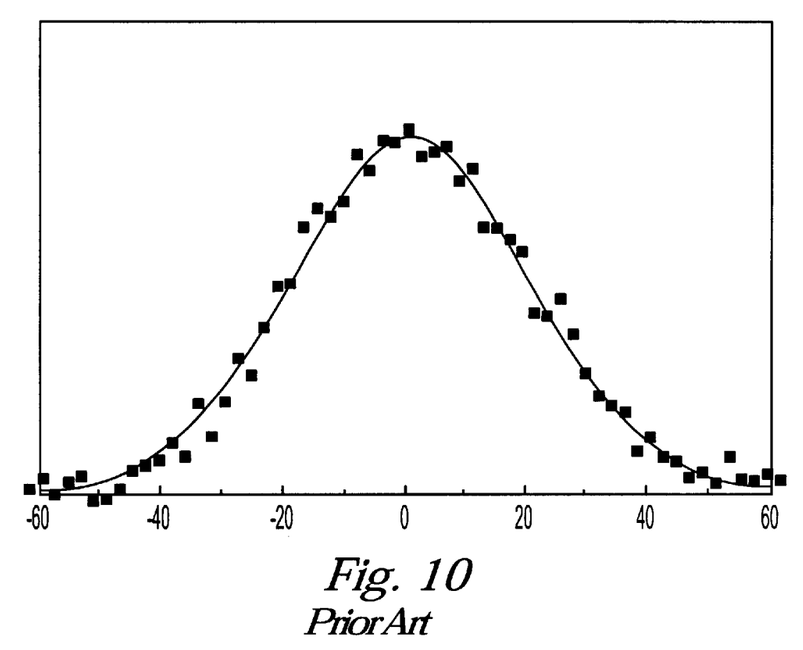
FIG. 10 plots the shape of a fast analog waveform using an optical correlator.

Reference is now made to FIG. 10, which plots the shape (44) of a fast analog waveform (actually, a laser pulse) as measured in the standard way by an optical correlator. FIG. 10 is prior art.

Figure 11:
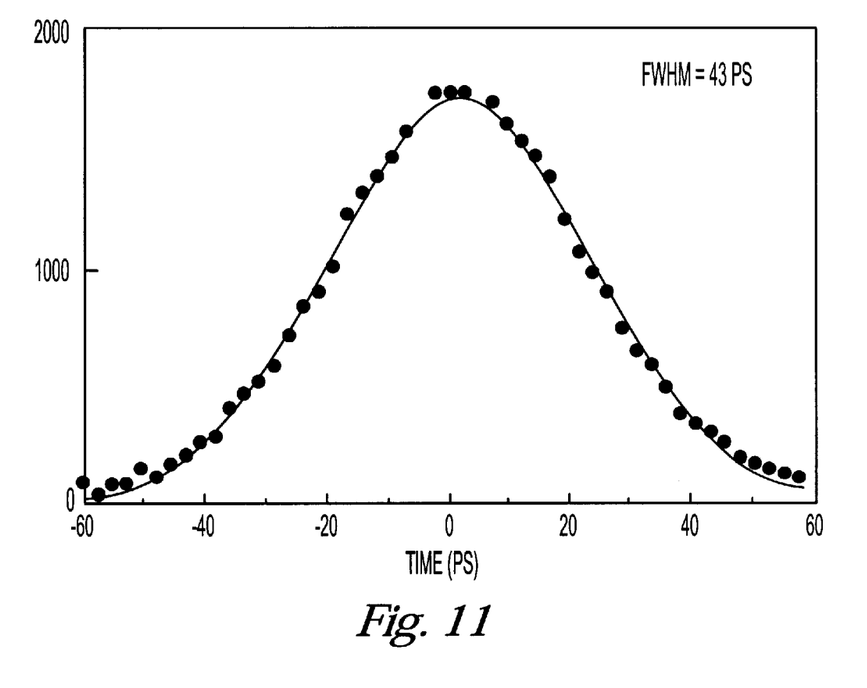
FIG. 11 shows a measurement of the same analog signal by a TOAD acting as an optical shutter.

Reference is now made to FIG. 11, which shows a measurement of the same analog signal by a TOAD acting as an optical shutter (41) in the manner of FIG. 9. The measurement was performed in the inventor's laboratory by creating a rudimentary sampling oscilloscope using approximately 43 psec-wide pulses from a 1.3 $\mu$m wavelength laser. The repetition rate was chosen as 10 nsec so that the output of the TOAD could be measured with a 100 MHz photodetector. The clocking train was shortened to 1 psec wide pulses at 500 femtojoules of energy per pulse, and was injected into the control port of the TOAD as gating pulses. A weaker branch of the same train was split from the first, acting as the lower amplitude signal to be measured, and was time-lagged along a precisely varied delay path before being injected into the input port of the TOAD as signal pulses. The delay path was then changed and the TOAD output measured again. The overall shape was obtained by sweeping the delay path of the signal relative to the control over a range of 100 psec. The FWHM $\sigma_-$=43 psec, and the area under the curve corresponds to the intensity of the input signal integrated over the time when the TOAD acted as an open shutter. It is clear by inspection that the measurement provided at least 6 bits of resolution on the ordinate axis.

Figure 12:
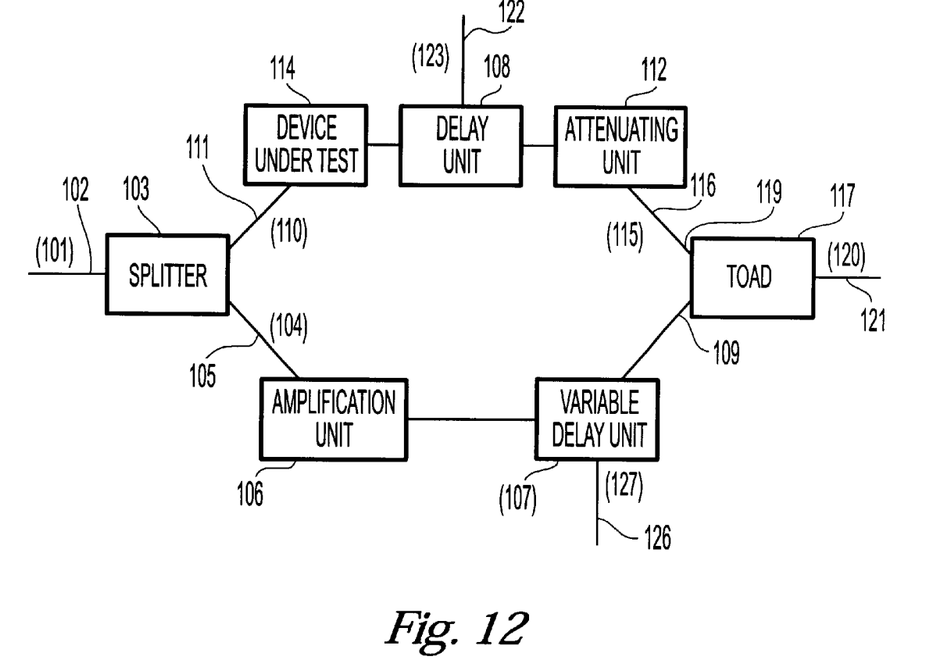
FIG. 12 illustrates an apparatus in the manner of a sampling oscilloscope.

The practiced sampling oscilloscope method indicates a useful analog application of the TOAD. The embodied sampling oscilloscope apparatus proves an alternative embodiment of the S/P converter wherein the fan-out feeds a plurality of branches—in this example, 1—and the conversion is repeated temporally at precisely known phase offsets, not necessarily sequentially, in order to measure the shape of a repeated signal. The signal must be reproducible in a finite time domain. A number of means for reproducible signal delay lines with sub-psec precision are known and could have been used instead to create the densely sampled phase offsets. Reference is now made to FIG. 12, which illustrates an apparatus in the manner of a sampling oscilloscope which relies upon analog data measured by a TOAD optical shutter. A coherent optical signal (101) is fed on optical path (102) to a splitter (103) which feeds an output signal (104) to optical path (105) and an output signal (110) to optical path (111). Signal (110) on optical path (111), even if weakened, enters device-under-test (114) and emerges as signal (115) on optical path (116). There may optionally be a plurality of amplifying units (106) along optical path (105); and/or there may optionally be a plurality of attenuating units (112) along the optical path traversing (103), (111), (114), and (116); in any case, at least one of these options must be implemented since the signal (115) must be weaker than the non-linear regime of the TOAD device (117) and signal (104) must be stronger than the switching threshold and must arrive at the input port (109) prior to the arrival of signal (115) at input port (119). The plurality of attenuation elements is depicted explicitly as a single unit (112) but could in practice be anywhere along said path, including merged with other units; likewise with the plurality of amplification units depicted as a single unit (106). There must also be a plurality of variable delay units (107) and/or (108) which introduce the phase offsets needed to sample the interval of interest. The control units can be internally controlled and/or externally controlled.

External control signal (127) would be introduced through path (126) and control signal (123) would be introduced through path (122). The TOAD (117) emits a signal (120) on optical path (121), said signal being representative of the convolution of the time aperture of optical shutter (117) with the amplitude of signal (115). Note that it is not strictly necessary for the elements mentioned-including the device-under-test, splitter, delay units, amplification units, attenuation units, and optical paths-to precisely preserve the color of signal (115) with respect to signal (104), since the clocking signal entering (109) is not interfered against the data signal (115) entering (119). Therefore, optical to-electrical and electrical-to-optical converters may be used advantageously in device-under-test (114).

Figure 13:
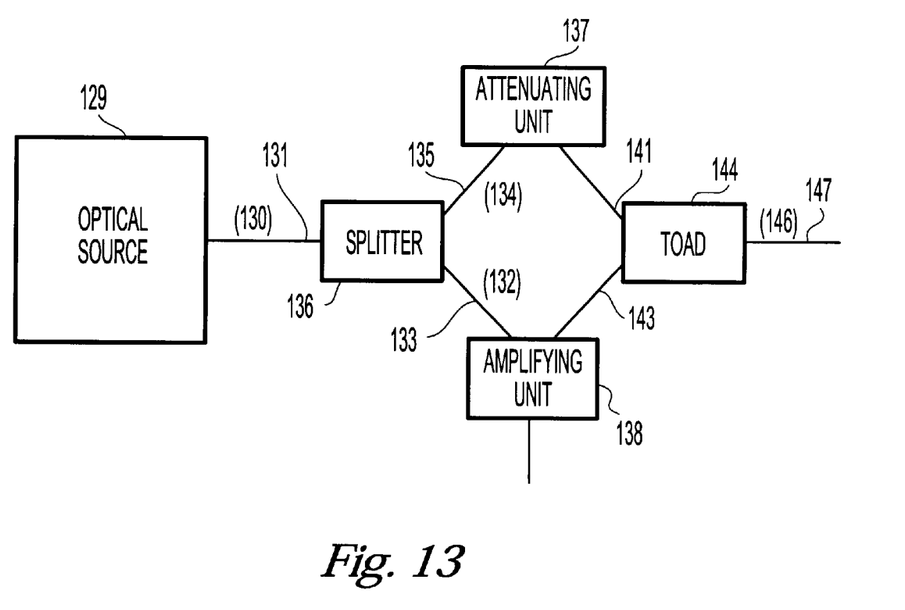
FIG. 13 illustrates a sampling oscilloscope using a TOAD acting as an optical shutter.

Reference is now made to FIG. 13, which illustrates an alternative embodiment in the manner of a sampling oscilloscope which relies upon analog data measured by a TOAD optical shutter and uses the waveform being measured additionally as its own clock signal. An optical source (129), which may advantageously be an electrical-to-optical converter, introduces a signal (130) onto optical path (131). A splitter (136) divides the signal (130) into signal (134) on optical path (135) and signal (132) on optical path (133). The embodiment attenuates (137) and/or amplifies (138) the signal. There must be at least one variable delay unit (not depicted) along the upper or lower path, as in FIG. 12. The clock signal is required to arrive at port (143) before the data signal arrives at port (141). The TOAD (144) emits a signal (146) on optical path (147).

Other embodiments of sampling oscilloscopes are known in industry and their reimplementation with TOAD-based optical shutters would be self-evident for one ordinary skill in the art.

Figure 14:
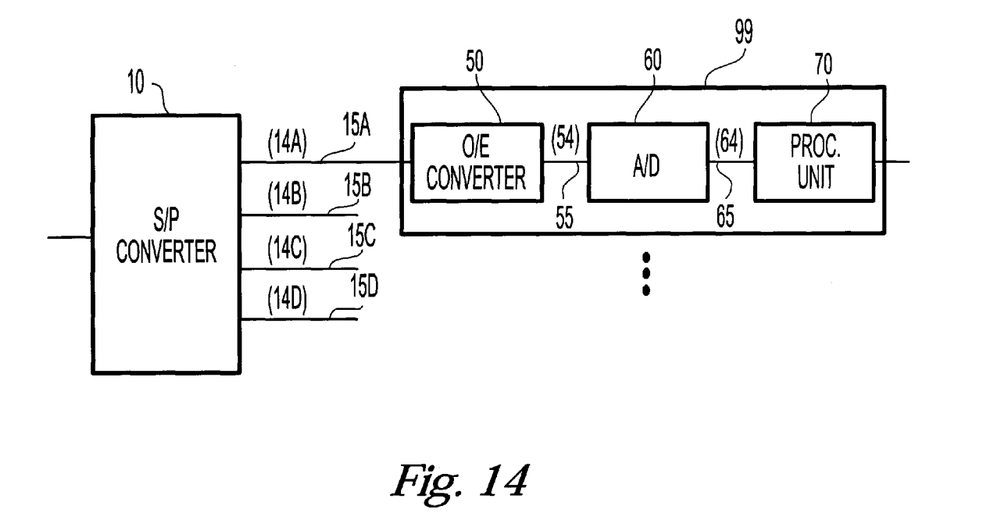
FIG. 14 illustrates an optical A/D converter system embedding an analog optical S/P converter.

Reference is now made to FIG. 14, which illustrates an optical A/D converter system (99) embedding an analog optical S/P converter. Preferably, an O/E converter (50) accepts an optical signal (14) from each of the paths (15)

emitted from a S/P converter (10), and converts said optical signal into an electrical signal (54). An A/D converter (60) accepts the electrical signal (54) from electrical lines (55) and produces a digital electrical representation (64). The electrical lines are likely to be transmission lines implemented as wires for low-speed operation and microwave plumbing or coaxial paths for high speed operation. Optionally, a processing unit (70) accepts said digital electrical signal (64) along electrical lines (65) and delivers a corrected, buffered version. In an alternative embodiment, the A/D converter may incorporate the O/E converter integrally, so (54) and (55) would be omitted.

Figure 15:
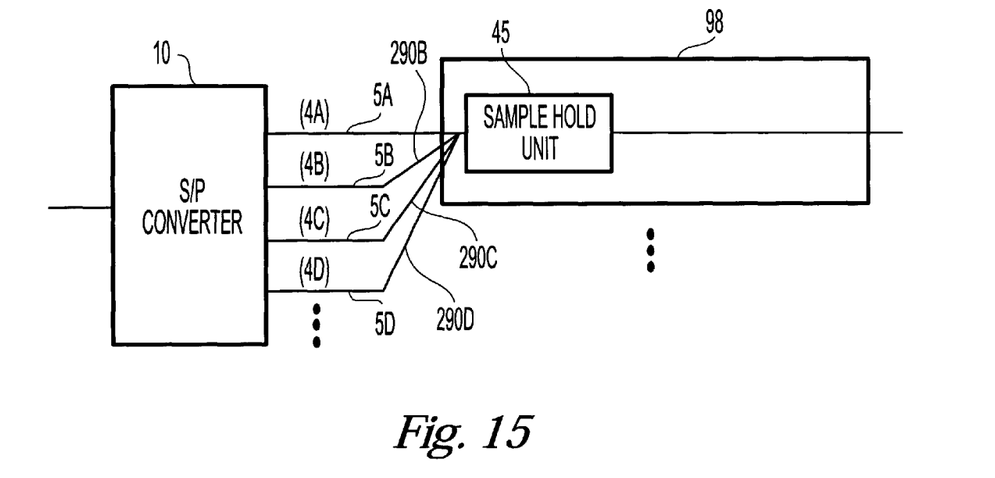
FIG. 15 illustrates an alternative embodiment of the slow A/D converter back-end.

Reference is now made to FIG. 15, which illustrates an alternative embodiment of the slow A/D converter back-end: an all-optical A/D converter (98). An optical sample-and-hold unit (45) accepts the optical signal (4) from its optical path (5), and slowly digitizes it, such as by the method disclosed in U.S. Pat. No. 4,947,170, incorporated herein by reference. The optical signal (4) may comprise a waveform encompassing a plurality of copies provided to a common input line in time sequence. The time sequence can be constructed, for example, by merging optional delay lines (290) of differing lengths, with the delay lines originating from a common output of (10).

Figure 16:
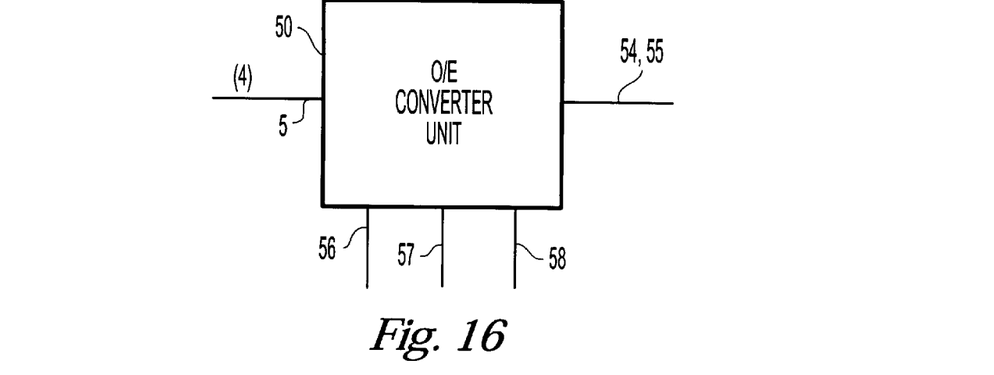
FIG. 16 illustrates a preferred slow O/E converter unit.

Reference is now made to FIG. 16, which illustrates a preferred O/E converter unit (50) for converting an analog optical signal (5) into an analog electrical signal (54) representative of it. Techniques for increasing the range and sensitivity and limiting the noise introduced by optical-to-electrical converters, such as photodetectors, are well-known. Common commercially available optical-to-electrical converters include avalanche photodetectors, photomultiplier tubes, charge-coupled devices, PIN junctions, photosensitive resistors, photovoltaic devices, and photosensitive capacitors, among others. Certain O/E converter implementations can advantageously be implemented with time-dependent control signals (56), such as a reset signal; with a powering unit (57); and/or with scaling unit (58), such as for dynamic range, bias and gain, linearity, or sensitivity settings, possibly entailing connections to other units in the system (not depicted). Each input path (5) may in fact comprise a plurality of optical paths, each carrying its own coded version of optical signal (4); each output path (55) may in fact comprise a plurality of electrical lines, each conveying its own coded electrical signal (54). The coding may be trivial (e.g. none) or complicated for reasons arising from fault tolerance, power reduction, noise reduction, and packaging, among others.

Figure 17:
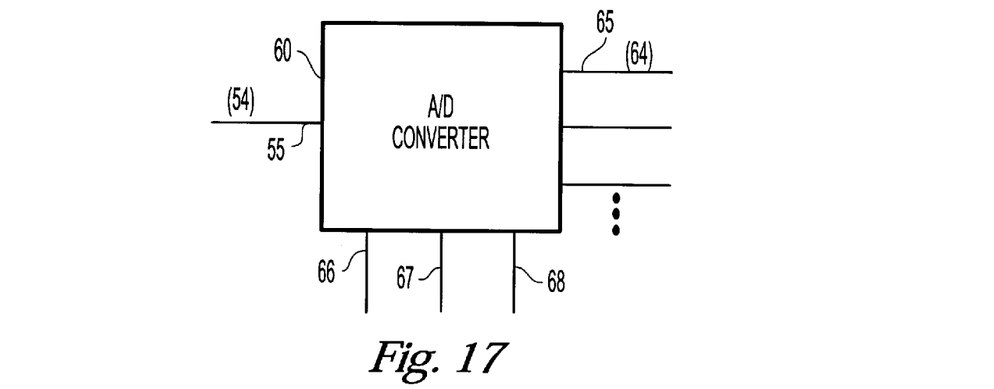
FIG. 17 illustrates a preferred slow electrical A/D converter unit.

Reference is now made to FIG. 17, which illustrates a preferred A/D converter (60) for converting an analog electrical signal (54) into a digital electrical signal (64) representative of it. In general, each A/D converter requires a time-dependent control signal (66), preferably a clocking signal related to the clocking signal of its optical particular optical shutter (40). A time-dependent control signal will also be provided to its processing unit (70) in order to know when to latch the signal, and analog sample-and-hold units or digital latches may advantageously be added at other points in accordance with well-known engineering practices. Certain implementations of A/D converter (60) can advantageously be implemented with additional time-dependent control signals (66), such as a reset signal; with a powering unit (67); and/or with scaling unit (68), such as for dynamic range, bias and gain, linearity, or sensitivity settings, possibly entailing connections to other units in the system (not depicted). Each input path (55) may in fact comprise a plurality of electrical lines, each carrying its own coded version of electrical signal (54); the coding may be trivial (e.g. none) or complicated for reasons arising from fault tolerance, power reduction, noise reduction, and packaging, among others. Each output path shown as (65) will generally comprise a multiplicity of electrical lines, each conveying its own coded electrical signal (64), where the coding will preferably be binary.

Figure 18:
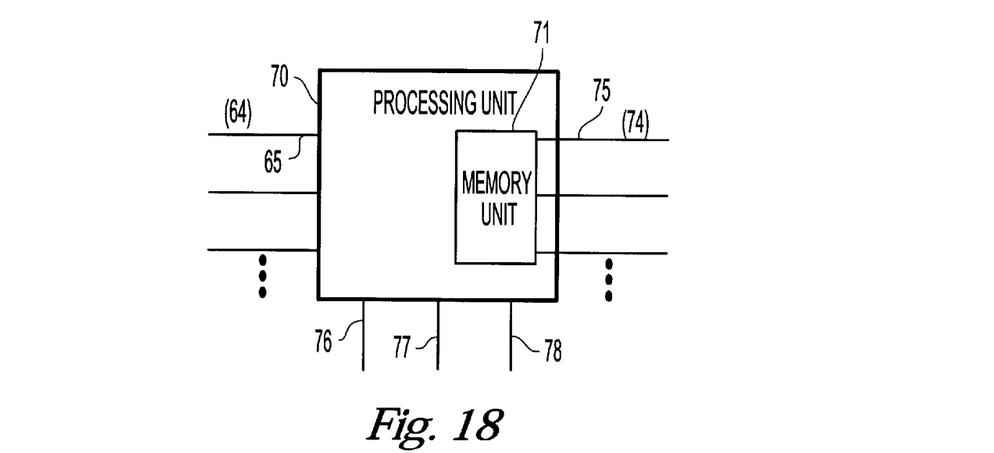
FIG. 18 illustrates a preferred processing unit.

Reference is now made to FIG. 18, which illustrates a preferred processing unit (70) for converting a plurality of digital electrical signals (64) into a different plurality of electrical signals (74) representative of it. In the preferred embodiment, processing unit (70) is optional. A powering unit (77) will advantageously be required for (70). Certain implementations of processing unit (70) can advantageously be implemented with time-dependent control signals (76), such as a reset signal or output bus system clock signal; and/or with scaling unit (78), such as for dynamic range, bias and gain, linearity, or sensitivity settings, possibly entailing connections to other units in the system (not depicted). For each stage (70), custom calibrations can be measured through the individual path through (10), (40), and (50). The calibrations can be applied locally or later; a lookup table may advantageously be employed with or without calibration data using memory unit (71) in order to expedite remapping signals to appropriate (e.g. linear) representations of the original input waveform's magnitude at a given time. Examples of the other units in the system would be from an input stage to servo the dynamic range. Each input path (65) generally comprises a plurality of electrical lines, each carrying its own coded version of electrical signal (64). The coding may be trivial (e.g. none) or complicated for reasons arising from fault tolerance, power reduction, noise reduction, and packaging, among others.

In the preferred embodiment, the ensemble of electrical signals (74) will be buffered, latched, and clocked onto a system bus by way of lines (75), in which case a memory unit (71) is also provided for the processing unit (70). For this reason, the synchrony of presenting the ensemble of electrical signals (74) to a system bus restricts the architecture in which the processing unit (70) is implemented. Simple digital systems require a master clock which will advantageously be the cycle time of the flyback signal (35), so all the latched bits will be injected onto the system bus simultaneously. Such an embodiment produces a large current impulse dI/dt, hence large simultaneous switching noise which must be decoupled with a large, expensive capacitance between power and ground. More complicated but affordable digital systems splay the latched bits onto the bus over a distribution of time slots, reducing the requirement for decoupling capacitance in proportion to the increase in the rise time window, dt.

Each output path (75) will generally comprise a plurality of electrical lines, each conveying its own coded electrical signal (74), where the coding will advantageously be binary and optionally for error detection/correction. In alternative embodiments, the output path (75) may convey data other than binary electrical signals, such as multistate digital, accept/reject/don't_care evaluations, alarms, acoustic signals, or mechanical action.

Figure 19:
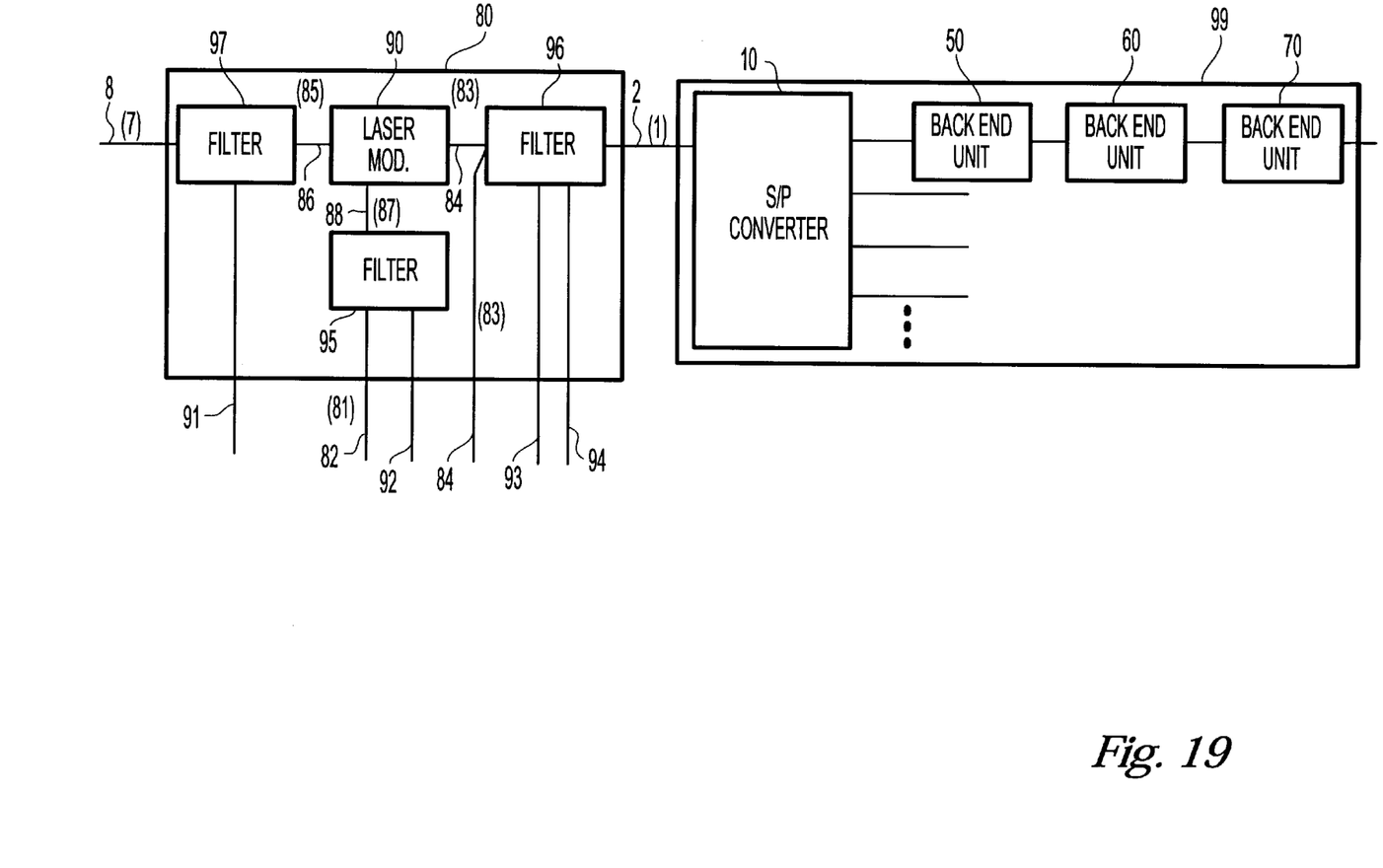
FIG. 19 illustrates an A/D converter system with analog electrical input and digital electrical output.

Reference is now made to FIG. 19, which illustrates an A/D converter system with analog electrical input and digital electrical output. Note that in the preferred embodiment, processing unit (70) is optional. In the preferred embodiment, an input stage (80) is implemented as a laser modulator (90), such as the module sold by United Technologies Photonics (UTP). Other input stages may be advantageous, such as the method and apparatus disclosed in U.S. Pat. No. 4,681,449, incorporated in its entirety herein by reference. Laser modulator (90) receives an electrical input signal (7) and a constant, coherent light source (81); its output signal (83) is the modulation of light signal (81) by the amplitude or intensity of the electric input signal (7). It may be advantageous to embed the A/D converter system in other circuitry, including front-end circuitry, in order to enable applications described herein below.

The dynamic range of the TOAD devices (41) is finite, so rescaling the input signal that reaches the S/P converter (10) advantageously broadens the dynamic range of operation for the system comprising (10) and (99). Attenuation can avoid non-linear and time-dependent saturation effects while amplification can avoid a noise floor. In the preferred embodiment, an optional electrical filter (97) can be employed to bias, attenuate or amplify the electrical input signal (7) from a microwave guide (8) into electrical signal (85) along path (86). In the preferred embodiment, the electrical filter (97) is a dynamically variable voltage divider and traveling wave amplifier. In an alternative embodiment, an optional optical filter (95) optically amplifies or attenuates a constant coherent signal (81) from path (82) as signal (87) on path (88). In an additional alternative embodiment, an optional optical filter (96) optically amplifies or attenuates a time-varying optical signal (83) from path (84) as signal (1) on path (2). Note that path (84) is marked twice since it may advantageously be accessible from outside unit (80). For instance, if an optical input signal is available instead of an electrical input signal, the filter (96)-which is depicted as part of optional unit (80)-may still be advantageously employed as a front-end to the A/D converter system (99) without using electrical inputs. An optional reference beam (94) may also be fed into the system for various reasons, notably to convert a phase modulated signal (83) into an amplitude modulated signal (1), or to bias a signal (83).

Typically, a first control unit (not shown) would provide a first control signal (91) to filter (97), a second control unit (not shown) would provide a second control signal (92) to filter (95), and a third control unit (not shown) would provide a third control signal (93) to filter (96). The control unit would be set by the downstream processing unit (70); processing unit (70) may establish the need to set control signals (91), (92), and/or (93) from data reported to it by (78) from externally or from units (50), (60), or (80). It may be advantageous to servo the input filters (95), (96), and/or (97) and performance characteristics of the back-end units (50), (60), and/or (70), for instance to diagnose problems or optimize performance. Some, none or all of these optional filters and connections to (70) may be employed. In the absence of unit (97), electrical path (86) is electrical path (8), and electrical signal (85) is electrical signal (7). In the absence of unit (95), optical path (88) is optical path (82), and optical signal (87) is optical signal (81). In the absence of unit (96), optical path (2) is optical path (84), and optical signal (1) is optical signal (83).

Figure 20:
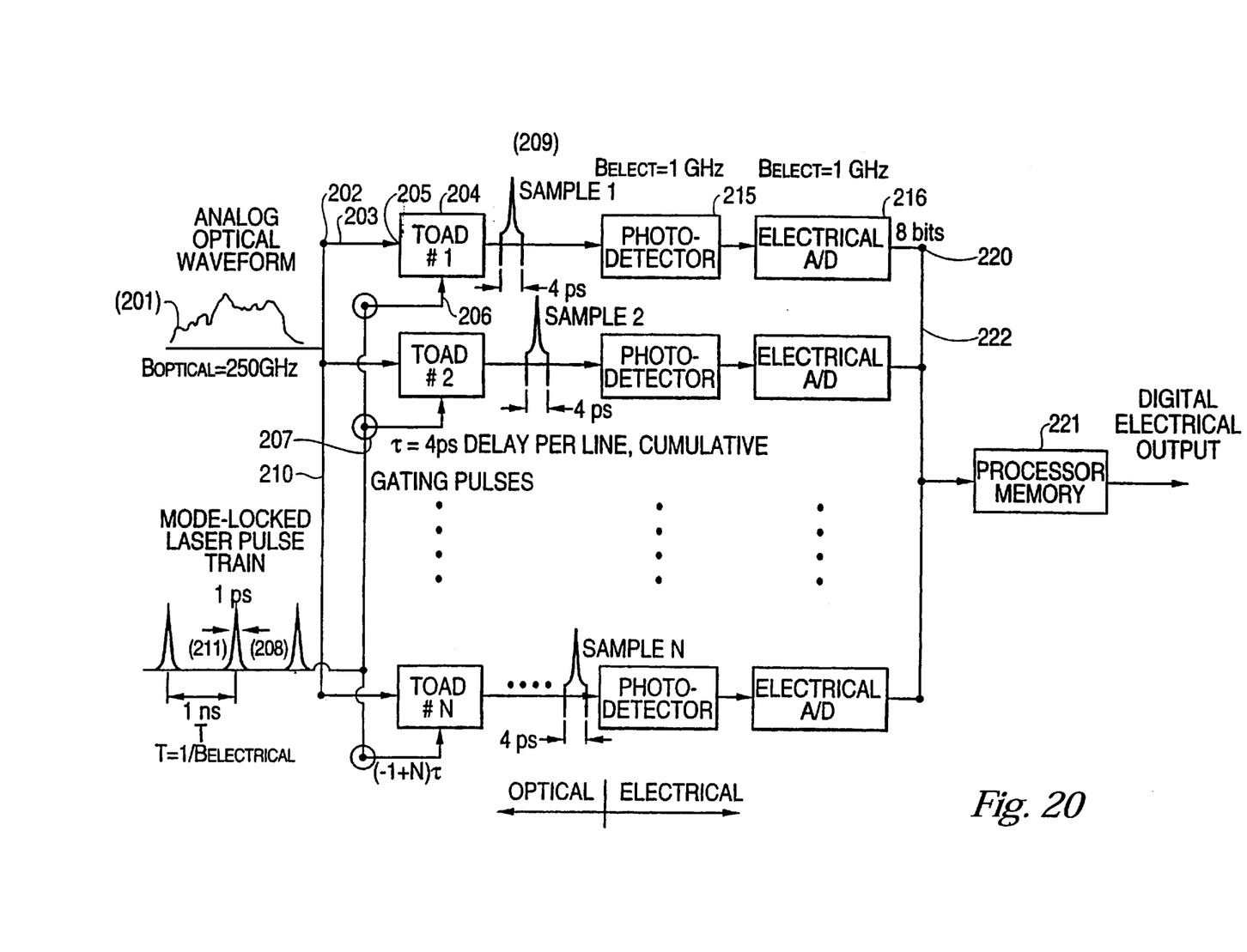
FIG. 20 summarizes an alternative A/D converter embodiment.

Reference is now made to FIG. 20, which concisely depicts an alternative embodiment employing N=250-fold fan-out in the S/P converter, a 1 psec external clock waveform, $\tau\_=4$ psec TOAD apertures, and $B_{electrical}=1$ GHz electronics to sample a $B_{optical}=250$ GHz optical waveform at 250 GSPS. This embodiment synchronously distributes a high-speed serial data stream into a large number of low-speed parallel data streams. Slower data streams are photoconverted, then sampled by all-electrical A/D converters, and then latched into a memory unit.

An optical waveform (201) enters at the upper left-hand corner of the diagram. The optical waveform is distributed N-ways by an optical splitter, where the fan-out N is given by $N=B_{optical} \div B_{electrical}$. The larger the electrical bandwidth $B_{electrical}$, the smaller the requisite minimum size of the splitter. For example, if the optical (input) bandwidth were 20 GHz and the A/D converter leaf nodes each operated at 1 GHz, then at least a 20-way splitter would be required. The repetition rate of the mode-locked laser driving the system is chosen to correspond to the bandwidth of the electronics, that is, $1/T=B_{electrical}=250$ GHz. Here, the fan-out is 250-fold by a star splitter hierarchy (202) into 250 equivalent taps, each feeding an equal length delay line (203) followed by a TOAD (204).

Each TOAD has two inputs, one for the signal (205) and one for the control or gating pulse (206). The gating pulses will cause the TOAD to open a 4 psec sampling window (209), allowing that portion of the analog waveform from the signal input to pass to the output of the TOAD and onward. The remainder of the analog waveform outside the 4 psec window is suppressed and does not pass to the output of the TOAD.

Each TOAD connects its gating input to a delay line (207) a unique distance from a mode-locked laser pulse source, most readily through a hierarchical clock distribution tree (210). Timing of the control pulses at each TOAD is staggered by a $\tau\_=\_4$ psec increment from its neighbors, so that the N samples produced at the outputs of the N adjacent TOADs monitor 4N psec. The N samples are taken during a time period $T=N \tau\_=N B_{optical}=1/B_{electrical}$. Some time later, when the N samples have been taken, the next mode-locked laser pulse (211) enters the array of TOADs and another series of N samples is taken. A continuous sample is composed piecewise as each TOAD takes a snapshot through its time-limited window on the waveform, shoulder to shoulder with the other TOADS. In this way the sampling of the analog waveform continues round-robin without interruption. In practice, the repetition rate of mode-locked lasers can be from kHz to THz.

The pulse energy required after the splitter is approximately 500 femtojoules. This is readily achieved by using a conventional Nd:YLF laser if N<100. Here, with N=250, an amplified mode-locked fiber ring laser or a mode-locked semiconductor laser may be used. If insufficient power is available from the laser, then several lasers may be synchronously mode-locked.

Note that timing jitter within the A/D is negligible: arbitrarily smaller than the Nyquist limit. The lengths of the (fiber optic or solid state waveguide) delay lines are set at manufacturing time and can be compensated for foreseeable or measurable variations in temperature, humidity, vibration, or voltage supply. The system's spurious free dynamic range will therefore be limited by drift in the timing of the externally supplied control pulse and should preferably exceed 120 dB within the A/D module.

The timing control pulse can be physically clocked as in FIG. 5 with a precision well below the Nyquist limit, leaving no measurable jitter within the specified operating rate.

Each of the TOADs then feeds a dedicated photoconverter (215) (e.g. a semiconductor avalanche photodiode or PIN junction, depending on energetics). Note that the photodetectors under consideration can be filled at any rate (e.g. over 1 psec or 1 $\mu$sec) and can recover faster than the A/D converters (216) they feed, so final low-cost A/D conversion remains the rate-limiting event.

The output is subsequently electrical, and is digitized by each A/D converter (216) at, for example, 1 GSPS with 8-bit resolution. The 1 GHz cycle time is sufficiently slow that the photodetector and A/D converter electronics can respond and recover completely and be ready for the next sample.

In the preferred embodiment, local control logic (220) remaps each A/D converter's output channel against a calibration table to ensure linearity, and then either stores the data (221) for later downloading at leisure, or else writes the electrical data to a very wide synchronous bus (222). The bus (222) does not need to operate at the same speed as the (rate-limiting) A/D converters (216), and making the bus (222) faster or reading a slower input signal would permit the bus (222) to be proportionately narrower.

While the foregoing description has touched upon various preferred embodiments and applications of the instant invention, those skilled in the art, having read the foregoing, will immediately recognize that the concepts detailed therein can be implemented and/or used in numerous obvious alternative structures and applications. Accordingly, it is understood that the scope of applicants' invention shall not be limited to those preferred and/or exemplary embodiments described herein, but instead, shall be defined exclusively by the finally-issued claims (which claims are intended to be read in the broadest reasonable manner), and any and all equivalents thereto.

What is claimed is:

1. An optical-to-electronic convertor, comprising:
    an input port, which receives an optical signal that is to be sampled;
    an optical sampler stage including at least one high-speed optical shutter, which samples the optical signal at a first sampling rate by opening and closing the at least one high-speed optical shutter and which provides a plurality of sampled optical signals as a result thereof, the optical sampler stage including a plurality of parallel channels, each different channel providing a different one of said plurality of sampled optical signals, the optical sampler stage including a splitter for splitting the optical signal into a plurality of identical optical signals prior to the sampling at the first sampling rate; and
    an electronic analog-to-digital converter stage, which converts the plurality of sampled output signals into a plurality of digital signals, the electronic analog-to-digital converter stage performing the converting at a second sampling rate slower than the first sampling rate.

2. The optical-to-electronic converter as recited in claim 1, wherein the electronic analog-to-digital converter stage comprises a single analog to digital converter which receives the outputs from each of the plurality of parallel channels in a time sequential manner.

3. The optical-to-electronic converter as recited in claim 1, wherein the electronic analog-to-digital converter stage comprises a plurality of electronic converters disposed in a plurality of parallel channels, wherein the plurality of channels of the electronic analog to digital converter stage respectively receive the sampled optical signals output from the plurality of parallel channels of the optical sampler stage.

4. The optical-to-electronic converter as recited in claim 1, further comprising a conversion stage disposed between the optical sampler stage and the electronic analog-to-digital converter stage, the conversion stage performing a conversion of the plurality of sampled optical signals into a plurality of electronic sampled signals.

5. The optical-to-electronic converter as recited in claim 4, wherein the conversion stage includes a plurality of photodetectors respectively disposed in the plurality of parallel channels of the optical sampler stage.

6. The optical-to-electronic converter as recited in claim 5, wherein the optical sampler stage comprises:
    a plurality of terahertz optical asymmetric demultiplexer assemblies (TOADs) respectively disposed in the plurality of parallel channels of the optical sampler stage and each configured to sample a corresponding one of the plurality of identical optical signals at different times,
    wherein the plurality of detectors are respectively disposed between the plurality of TOADs and the electronic analog-to-digital converter stage.

7. The optical-to-electronic converter as recited in claim 3, wherein the plurality of parallel channels of the optical sampler stage corresponds in number to n, and
    wherein n multiplied by the second sampling rate is approximately equal to the first sampling rate.

8. An optical to electronic converter, comprising:
    a first input port configured to receive an analog optical waveform;
    a splitter connected to the first input port and configured to split the analog optical waveform into a plurality of approximately identical waveforms;
    a second input port configured to receive a clock signal having a predetermined clock period;
    a delay circuit configured to receive the clock signal and to output a plurality of delayed clock signals each having a different delay with respect to other of the delayed clock signals;
    a plurality of terahertz optical asymmetric demultiplexer configured to respectively receive the plurality of approximately identical waveforms on an input port thereof, and configured to receive a corresponding one of the plurality of delayed clock signals on a control port thereof, each of the plurality of terahertz optical asymmetric demultiplexers having an output port for outputting the corresponding one of the plurality of approximately identical waveforms within a fixed time period;
    a plurality of photodetectors, each different photodetector connected to a different one of said output ports of the plurality of terahertz optical asymmetric demultiplexers and configured to convert an input optical signal into an output electrical signal; and
    a plurality of electrical analog-to-digital converters respectively connected to the output ports of the plurality of terahertz optical asymmetric demultiplexers and configured to perform an analog-to-digital conversion of the corresponding electrical signal into a digital signal,
    wherein a number corresponding to said plurality of electrical analog-to-digital converters is a value such that a conversion time of the plurality of electrical analog-to-digital converters divided by the number of said plurality of electrical analog-to-digital converters is approximately equal to the time period of the plurality of terahertz optical asymmetric demultiplexers.

9. A method of optical sampling, comprising the steps of:
    receiving an optical signal that is to be sampled;
    splitting the received optical signal into a plurality of approximately identical optical signals; and
    respectively providing the approximately identical optical signals to a plurality of channels of an optical stage; and
    sampling, at the optical stage, the optical signal at a first sampling rate by opening and closing a high-speed optical shutter and providing a plurality of sampled optical signals as a result thereof, each of the plurality of parallel channels of the optical stage providing a different one of said plurality of optical signals.

10. The method as recited in claim 9, further comprising the step of converting the plurality of sampled optical signals into a plurality of electrical sampled signals.

11. An analog optical sampler, comprising:

a first input port that is capable of receiving an analog optical waveform that is to be sampled;

a second input port that is capable of receiving a clock signal;

at least one Terahertz Optical Asymmetric Demultiplexer (TOAD) that is configured to receive the analog optical waveform and the clock signal; and an output port, from which is output a sample of the analog optical waveform, the sample being provided to the output port based on an output of at least one TOAD;

wherein the analog optical waveform is sampled when said TOAD is triggered by the clock signal.

12. The analog optical sampler as recited in claim 11, wherein at least one of the first input port, the second input port, and the output port includes an optical waveguide or an optical fiber.

13. The analog optical sampler as recited in claim 12, wherein distinct polarizations or colors are used to multiplex the first and second input ports on a same optical waveguide or optical fiber.

14. The analog optical sampler as recited in claim 11, wherein the at least one TOAD includes a Mach-Zehnder interferometer.

15. An optical sampler system, comprising:

a first input port, which receives an optical analog waveform that is to be sampled;

a second input port, which receives an optical clock signal at a clock rate;

a plurality of optical samplers, which produce a plurality of sampled optical waveforms from said optical analog waveform at a rate dependent on said clock signal, at least one of said plurality of optical samplers including a Terahertz Optical Asymmetric Demultiplexer (TOAD); and a plurality of output ports, which output said plurality of sampled optical waveforms.

16. An optical sampler system, comprising:

a plurality of first input ports for receiving an optical analog waveform;

a plurality of second input ports for receiving an optical clock signal at a clock rate;

a plurality of optical sampler nodes for respectively producing a plurality of sampled optical waveforms from said optical analog waveform at a rate dependent on said clock signal;

a plurality of output ports for respectively outputting said plurality of sampled optical waveforms;

a first optical distribution network for replicating and delivering a plurality of copies of said optical clock signal; and a second optical distribution network for replicating and delivering a plurality of copies of said optical analog waveform, said second optical distribution network including delay lines of differing optical lengths so as to provide each of said plurality of optical sampler nodes with a substantially unique timeslice of said analog optical waveform upon receipt of a corresponding one of said plurality of copies of said optical clock signal.

17. The optical sampler system as recited in claim 16, wherein said plurality of copies of said optical clock signal are delayed with respect to each other by a preset delay amount.

18. The optical sampler system as recited in claim 16, wherein at least one of said plurality of optical sampler nodes include at least one Terahertz Optical Asymmetric Demultiplexer.

19. The optical sampler system as recited in claim 16, further comprising an optical-to-electronic converter stage connected to at least one of said plurality of output ports, and configured to receive said sampled optical waveform and to convert said modulated optical waveform into an electronic waveform.

20. The optical sampler system as recited in claim 19, further comprising an analog-to-digital converter stage connected to said optical-to-electronic converter stage, and configured to convert said electronic waveform into a digital signal.

21. The optical sampler system as recited in claim 20, wherein said plurality of optical sampler nodes produce said plurality of sampled waveforms on a plurality of parallel channels, respectively, the plurality of parallel channels corresponding to n in number, n being an integer greater than one, wherein n multiplied by a first sampling rate of the conversion by said plurality of optical sampler nodes is approximately equal to a second sampling rate of said analog-to-digital converter stage.

22. The optical sampler system as recited in claim 16, wherein distinct signal levels of at least one of said copies of said optical clock signal and said copies of said optical analog waveform through distinct paths in said first and second distribution networks are provided as correction signals used to correct a calibration of subsequent magnitude measurements of said optical sampler system.

23. An optical sampler system, comprising:

a plurality of high-speed optical shutters, each having a signal input port capable of receiving an optical input signal, a trigger input port capable of receiving an optical clock signal, and an output port;

a first optical distribution network, which receives an optical clock signal and delivers a corresponding optical clock signal to the trigger input port of each optical shutter; and a second optical distribution network, which receives an optical analog waveform and delivers a corresponding optical analog waveform to the signal input port of each optical shutter;

wherein, for each optical shutter, the corresponding optical clock signal is synchronized with the corresponding optical analog waveform to open and close a gating window during which the optical shutter produces an optical waveform sample on its output port.

24. The optical sampler system of claim 23, wherein the high-speed optical shutter is a TOAD.

25. The optical sampler system of claim 23, wherein the high-speed optical shutter is open for a duration in the range from about 0.01 psec to about 100 psec.

26. The optical sampler system of claim 23, wherein the optical waveform sample produced by each optical shutter is substantially unique.

27. The optical sampler system of claim 23, wherein the second optical distribution network comprises delay lines of differing optical lengths.

28. The optical sampler system of claim 23, wherein the first optical distribution network comprises delay lines of differing optical lengths.

29. The optical sampler system of claim 23, further comprising an optical-to-electronic converter stage connected to the output ports of the plurality of high-speed optical shutters.

30. The optical sampler system of claim 23, wherein the first and second optical distribution networks each include an optical path over which correction signals are provided to correct a calibration of subsequent magnitude measurements of the optical waveform samples.

31. A method of sampling an optical signal, comprising the steps of:

receiving a continuous optical analog signal having an intensity that may be any value within two predetermined intensity limits;

receiving an optical triggering signal;

providing the continuous optical analog signal to an optical shutter;

providing the optical triggering signal to the optical shutter; and outputting from the optical shutter, a discrete sample segment of the continuous optical analog signal.

32. The method of claim 31, wherein the optical shutter is a high-speed optical shutter.

33. The method of claim 32, wherein the high-speed optical shutter is a TOAD.

34. The method of claim 31, wherein the duration of the discrete sample segment is within a range of about 0.01 psec to about 100 psec.

* * * * *